United States Patent [19]

Xu et al.

[11] Patent Number: 5,690,991
[45] Date of Patent: Nov. 25, 1997

[54] SUPERCONDUCTING JOINT BETWEEN $NB_3SN$ TAPE AND NBTI WIRE FOR USE IN SUPERCONDUCTING MAGNETS

[75] Inventors: Bu-Xin Xu, Florence; O'Neil T. McClam, Effingham; Geer Ward, Florence, all of S.C.

[73] Assignee: General Electric Company, Milwaukee, Wis.

[21] Appl. No.: 576,707

[22] Filed: Dec. 21, 1995

[51] Int. Cl.$^6$ .................. B05D 1/18; B05D 5/12
[52] U.S. Cl. .................. 427/62; 427/431; 427/436; 505/924; 505/925; 148/98
[58] Field of Search .................. 427/62, 431, 436; 505/924, 925; 148/98

[56] References Cited

U.S. PATENT DOCUMENTS 5,571,602  11/1996  Eckels et al. ................. 428/195
5,597,423   1/1997  Book et al. ................... 148/98

*Primary Examiner*—Roy V. King
*Attorney, Agent, or Firm*—Irving M. Freedman; John H. Pilarski

[57] ABSTRACT

A method of forming a superconducting joint between the $Nb_3Sn$ layer of a superconducting tape and a superconducting NbTi wire through use of a Pb-Bi bath, joint securing arrangement and mold around the joint.

20 Claims, 1 Drawing Sheet

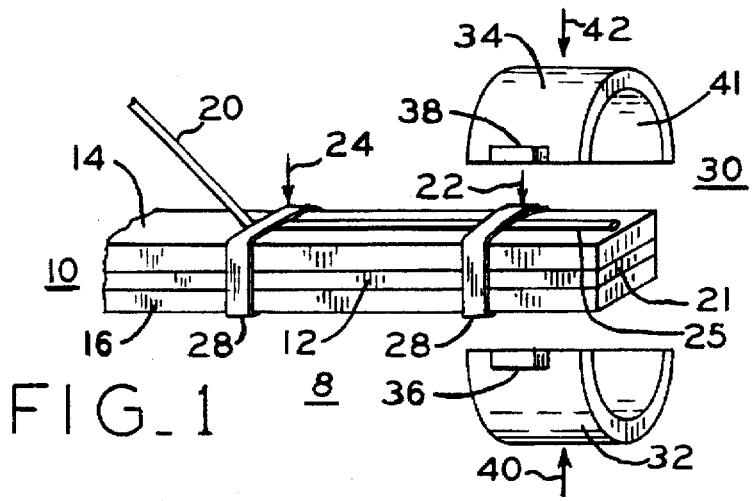
FIG_1
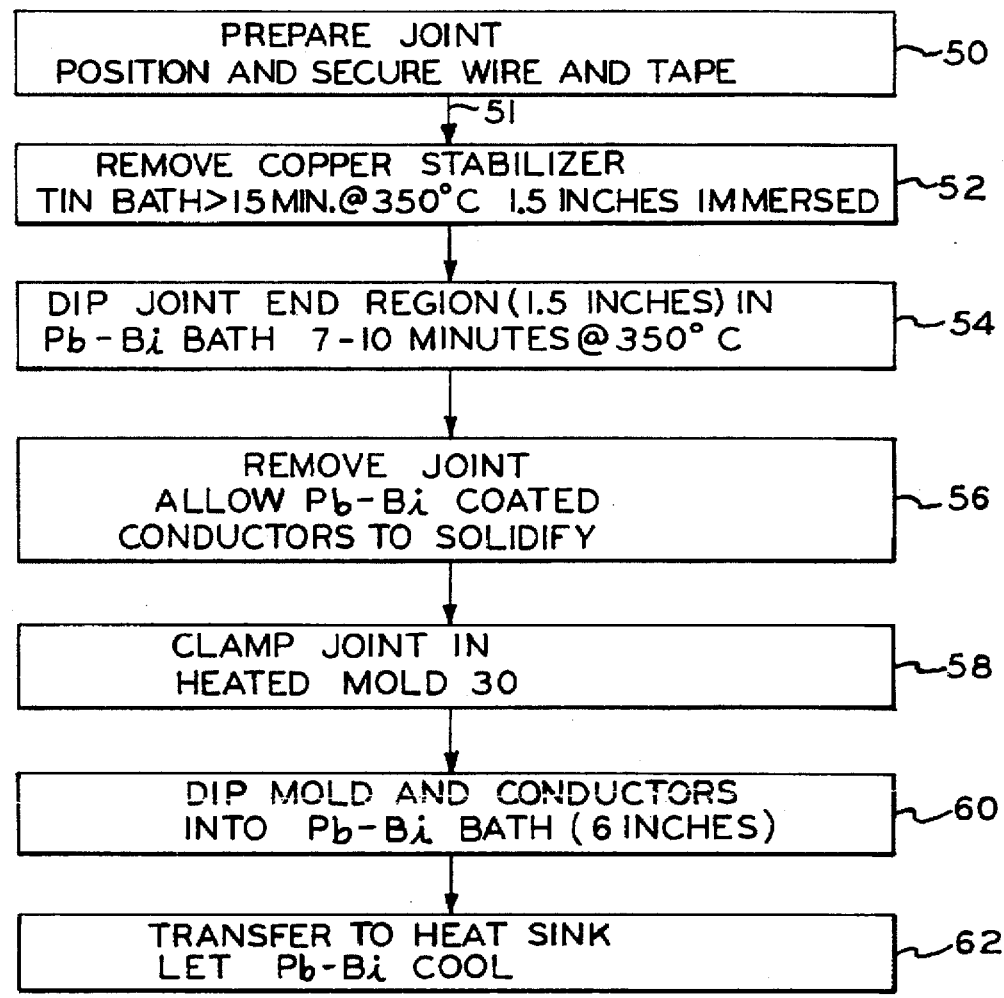
FIG_2

SUPERCONDUCTING JOINT BETWEEN NB₃SN TAPE AND NBTI WIRE FOR USE IN SUPERCONDUCTING MAGNETS

BACKGROUND OF INVENTION

Superconducting multifilament niobium-titanium (NbTi) wires are widely used in large size superconducting magnets for magnetic resonance imaging (hereinafter MRI). Niobium-Tin ($Nb_3Sn$) superconductor, generally in the form of tape rather than wire, is known to exhibit more desirable magnetic and operational characteristics than NbTi wire as regard important factors such as critical temperature, critical current and critical field. $Nb_3Sn$ has a critical temperature about 18K, and an upper critical field at zero K temperature, and about 28 T at 4.2K temperature. With the same magnetic field and at 4.2K temperature, the critical current density of $Nb_3Sn$ is generally a factor of 3 times higher than that of NbTi.

It is thus clear that $Nb_3Sn$ is a superior material from a superconducting magnetic performance point of view for higher performance superconducting magnet construction, especially for high field superconducting magnets. However, the mechanical properties of $Nb_3Sn$ pose serious problems in the fabrications of suitable superconducting conductors and superconducting magnets. $Nb_3Sn$ is hard and brittle, and as a result when used commercially it is often fabricated utilizing thin tapes on which is deposited a thin layer of $Nb_3Sn$ by surface diffusion or by chemical vapor deposition procedures.

In order to maximize performance, while also considering and balancing handling and cost differences in fabricating a superconducting magnet, there are advantages in using $Nb_3Sn$ tape conductors for winding superconducting magnets for use in the higher field regions of a MRI superconducting magnet, while using NbTi wires for the lower field regions of the same MRI superconductor magnet.

However, the combination use of $Nb_3Sn$ tape conductor and NbTi wires in a single superconducting magnet presents the need and problem of fabricating superconducting joints between the $Nb_3Sn$ tape and NbTi wire. It is important that such superconducting joints provide enough current carrying capability and eliminate heating due to the high current flow through the joints, and in turn minimize cryogen boiloff resulting from such heating.

In addition, in MRI applications superconducting switches are provided to keep a superconducting magnet in persistent operation. Such superconducting switches require high matrix resistance and good magnetic stability which is obtained with a thin layer of copper (about 0.001 inches thick) sandwiching the $Nb_3Sn$ tape conductor. The joining of such copper stabilized $Nb_3Sn$ tape and NbTi wire when also used in the same superconducting magnet requires a high performance superconducting joint in order to maintain a satisfactory drift rate in superconducting magnet persistent mode operation for the MRI equipment.

OBJECTS AND SUMMARY OF INVENTION

It is an object of the present invention to provide improved superconducting joints between $Nb_3Sn$ tape and NbTi wire which is suitable for use in MRI applications.

It is another object of the present invention to provide a superconducting joint between $Nb_3Sn$ tape and NbTi wire which eliminates heat losses and minimizes drift rate in superconducting magnet operation.

It is a further object of the present invention to provide a superconducting joint between $Nb_3Sn$ tape and NbTi wire to enable and facilitate their combined use in superconducting magnets.

In accordance with one form of the present invention, a method of forming superconducting joints for use in superconducting magnets between $Nb_3Sn$ superconducting tape and NbTi superconducting wire is provided. When the $Nb_3Sn$ tape is sandwich between copper stabilizing layers, a copper layer and any copper encapsulation of the NbTi wire is removed by dipping the contact area into a molten tin bath maintained at approximately 350° C. for a period in excess of 15 minutes. The $Nb_3Sn$ tape is then positioned into contact with the NbTi wire to form a contact area which may be maintained by wrapping a retaining tape around a small portion of the contact area applying molten Pb-Bi to coat the contact area and allowing the coating to cool. More particularly, the Pb-Bi is applied in a molten bath by dipping the contact area into the molten bath which is maintained at approximately 350° C. with the dipping being for a period of approximately 7 to 10 minutes. A detachable preheated mold is then temporarily fastened around the contact area prior to a second dipping. The mold is removed after the superconducting joint is formed in the bath and the joint is allowed to cool.

DETAILED DESCRIPTION OF PREFERRED EMBODIMENT OF INVENTION

FIG. 1 illustrates the present invention.

FIG. 2 is a block diagram chart useful in explaining the fabrication of the invention shown in FIG. 1.

Referring to FIGS. 1 and 2, $Nb_3Sn$ superconducting tape 10 includes a layer of $Nb_3Sn$ 12 sandwiched between a pair of layers of stabilizing copper foil 14 and 16, the copper being in the order of about 0.001 inches thick. FIG. 1 is not drawn to scale with the thickness of layers 12, 14 and 16 being increased in order to better illustrate the invention.

Superconducting NbTi wire 20 is positioned in contact with one side of superconducting tape 10 and Perma-seal retaining tape 28 in the order of 12 mm wide is wrapped around the contact area at approximately 2 inches from end 21 of superconducting tape 10, and is also wrapped around a region approximately 6 inches from the end as indicated by arrow 24. Perma-seal retaining tape 28 is utilized to retain superconducting tape 10 and superconducting wire 20 in position during subsequent formation of the superconducting joint in contact area 25 between end 21 of superconducting tape 10 and Perma-seal retaining tape 28 at arrow 24. Perma-seal retaining tape 28 at arrow 24 assists in preventing any sharp bending which could damage tape 10.

With copper stabilizing layers 14 and 20 overlying $Nb_3Sn$ layer 12 of superconducting tape 10 and copper coated NbTi wire 20 as shown in FIG. 1, the copper is removed in contact area 25 before a superconducting joint is formed between the superconducting tape and wire to enable direct contact between the $Nb_3Sn$ and NbTi. This is accomplished by dipping or submerging 52 approximately one and one half inches of contact area 25 in a tin bath of 99.9% pure tin heated to 350° C. for a period in excess of 15 minutes. Prior to the immersion, the top of the tin bath may be cleaned with a stainless steel spatula to removed any oxides or foreign materials.

Once the contact area 25 for the joint has copper layer 14 etched off, the assembly or joint 8 is removed from the tin bath and immediately transferred to a Pb-Bi bath up to the 1.5 inch mark close to arrow 22. The Pb-Bi bath is at 350° C. and joint 8 remains in the bath for a period of approximately 7 to 10 minutes.

Meanwhile, a mold or enclosing form 30 is set on top or adjacent to the bath to allow it to warm before molding the complete joint. At the end of the 7–10 minute period, the end joint 8 is lifted out of the Pb-Bi bath to allow the Pb-Bi coated ends of superconducting conductors 12 and 20 to solidify or harden. The ends of conductors 12 and 20 are then put into joint mold or enclosing form 30 consisting of upper half 34 and lower half 32 with a clamp or securing device 36, 38 on the outside of the mold for retaining the halves together when clamped 58 around contact area or joint 25. Mold 30 had an internal bore 41 slightly larger in diameter than Pb-Bi coated conductors 10 and 20 and extends approximately 2 inches from end 21, that is approximately up to arrow 22.

The Pb-Bi coated conductors 12 and 24 along with their surrounding mold 30 are then submerged into the Pb-Bi bath. Joint 8 including conductors 12 and 20 and mold 30 is shaken slightly to remove any air bubbles within the mold and to allow Pb-Bi to be formed within mold 30 and around superconductors 12 and 21 in contact area 25.

Mold 30 and joint 8 are then carefully lifted out of the bath and transferred to a heat sink stand with the joints being held straight in the mold until the Pb-Bi cools Upon cooling, mold 30 is removed and joint 8 is complete. Perma-seal retaining tape 28 at arrow 26 may be removed, if desired, although this is not necessary. During the process care should be taken not to put sharp bends in the $Nb_3Sn$ because of potential damage to the superconducting material. Also care should be taken while clamping superconducting conductors 10 and 20 in heated mold 30 to prevent overtightening and deformation of tape 12 or joint 25.

By way of summary, and with particular reference to FIG. 2, the initial step 50 is to prepare joint 25 by positioning and securing superconducting wire 20 and superconducting tape 10. If superconducting tape conductor 10 and/or superconducting wire 20 includes a copper stabilizer layer it is necessary to remove 52 the copper from the superconductors in contact area or joint 25 as indicated by arrow 51. This is accomplished in a tin bath for as much as more than approximately 15 minutes at approximately 350° C. with one and one half inches of the end of the contact area being immersed. After the copper layer of encapsulation is removed joint 8 is removed from the tin bath and immediately transferred to a 350° C. PbBi bath 54 for approximately 7–10 minutes after which joint 8 is removed 56 from the PbBi bath to allow the Pb-Bi coated conductors 10 and 20 to solidify. Conductors 10 and 20 are then clamped 58 in heated mold 30 which may be heated by placing it proximate to the heated PbBi bath. Mold 30 and conductors 10 and 20 are then dipped 60 approximately 6 inches into the same Pb-Bi bath. After mold 30 is filled with molten PbBi the mold and conductors 10 and 20 are transferred 62 to a heat sink to let the Pb-Bi around joint 25 cool. Mold 30 is then removed exposing Pb-Bi coated superconducting joint 25 suitable for use in MRI equipment through the joining of $Nb_3Sn$ superconducting tape 10 and NbTi superconducting wire 20.

The suitability of joints 8 fabricated in accordance with the present invention for superconducting use were confirmed by testing which showed adequate and desirable magnetic characteristics.

While the present invention has been described with respect to certain embodiments thereof, it is to be understood that numerous variations and details and construction, the arrangement and combination of parts, and the type of materials use may be made without departing from the spirit and scope of the invention.

What we claim is:

1. A method of forming superconducting joints for use in superconducting magnets between an $Nb_3Sn$ superconductor tape NbTi superconductor wire comprising;

positioning said $Nb_3Sn$ superconductor tape into contact with said NbTi superconductor wire to form a contact area;

applying molten Pb-Bi to coat said contact area; and allowing said coating to cool.

2. The method of claim 1 wherein said Pb-Bi is applied in a molten Pb-Bi bath by dipping said contact area into said molten bath.

3. The method of claim 2 wherein said bath is maintained at a temperature of approximately 350° C. and said dipping is for a period of approximately 7–10 minutes.

4. The method of claim 3 wherein a mold is positioned around said tape and said wire in the region of said contact area.

5. The method of claim 4 wherein said mold is heated and said molten Pb-Bi is applied to said contact area within said mold.

6. The method of claim 4 wherein the application of Pb-Bi to said contact area within said mold is accomplished by a second dipping of said contact area plus said heated mold into said bath of molten Pb-Bi.

7. The method of claim 6 wherein said mold is clamped around said contact area prior to said second dipping.

8. The method of claim 7 wherein said $Nb_3Sn$ superconductor tape is sandwiched between copper stabilizing layers and said NbTi superconductor wire is encapsulated in a copper stabilizer and the copper in the region of said contact area is removed prior to said second dipping.

9. The method of claim 8 wherein said copper is removed by a different dipping of said contact area into a molten tin bath.

10. The method of claim 9 wherein said tin bath temperature is maintained at approximately 350° C. and said different dipping is for a period of time in excess of approximately 15 minutes.

11. The method of claim 10 wherein said positioning of said tape and said wire is maintained by wrapping a first retaining tape around a portion of said contact area.

12. The method of claim 10 wherein a second retaining tape is wrapped around an area which is approximately 3 times the distance from the ends of said contact area as is said first retaining tape.

13. The method of claim 7 wherein said wherein said mold is approximately 2 inches long and said contact area is approximately 1.5–2 inches, and said mold and contact area are placed on a heat sink after said another dipping.

14. The method of claim 13 wherein said contact area is dipped approximately 1.5 inches into said Pb-Bi bath in said first dipping.

15. The method of claim 12 wherein said retaining tape is Perma-seal tape and said wrapping of said second retaining tape is to protect the $Nb_3Sn$ superconductor tape from damage by bending.

16. The method of claim 7 wherein said mold is heated prior to being clamped around said contact area.

17. The method of claim 15 wherein the heating of said mold is provided by placing said mold proximate to said Pb-Bi bath.

18. The method of claim 13 where care is taken to prevent any sharp bends in said $Nb_3Sn$ tape.

19. The method of claim 16 wherein the pressure of said clamping on said contact area is controlled to prevent deformation of said tape.

20. The method of claim 9 wherein said tin bath is skimmed with a stainless steel spatula prior to said different dipping.

* * * * *